US012693348B2

(12) United States Patent
Melecio Ramirez et al.

(10) Patent No.: US 12,693,348 B2
(45) Date of Patent: Jul. 28, 2026

(54) DEVICE AND CORE LOSS CHARACTERIZATION METHOD FOR SCREENING CIRCUIT BREAKER SENSORS

(71) Applicant: Schneider Electric USA, Inc., Andover, MA (US)

(72) Inventors: Juan Ignacio Melecio Ramirez, North Liberty, IA (US); Collin Richard Fischels, Independence, IA (US); Kenneth Riehl, North Liberty, IA (US)

(73) Assignee: Schneider Electric USA, Inc., Boston, MA (US)

( * ) Notice: Subject to any disclaimer, the term of this patent is extended or adjusted under 35 U.S.C. 154(b) by 174 days.

(21) Appl. No.: 18/539,149

(22) Filed: Dec. 13, 2023

(65) Prior Publication Data

US 2024/0219482 A1     Jul. 4, 2024

Related U.S. Application Data

(60) Provisional application No. 63/436,458, filed on Dec. 30, 2022.

(51) Int. Cl.
G01R 31/62 (2020.01)

(52) U.S. Cl.
CPC ................................... G01R 31/62 (2020.01)

(58) Field of Classification Search
CPC ...................................................... G01R 31/62
USPC ......................................................... 324/547
See application file for complete search history.

(56) References Cited

U.S. PATENT DOCUMENTS

| | | | | |
|---|---|---|---|---|
| 1,170,608 | A | * | 2/1916 | Chubb ................. G01R 33/123 |
| | | | | 324/222 |
| 5,541,521 | A | * | 7/1996 | North ................... G01R 31/001 |
| | | | | 324/627 |
| 2002/0097126 | A1 | | 7/2002 | Fujiwara et al. |
| 2011/0125422 | A1 | | 5/2011 | Goncalves Jota et al. |
| 2013/0049744 | A1 | * | 2/2013 | Mu ........................ G01R 33/14 |
| | | | | 324/222 |
| 2021/0358685 | A1 | * | 11/2021 | B ............................ G01R 33/14 |
| 2022/0082590 | A1 | | 3/2022 | Steuer et al. |
| 2023/0314531 | A1 | * | 10/2023 | Keig ...................... G01R 31/40 |
| | | | | 318/432 |

OTHER PUBLICATIONS

International Search Report and the Written Opinion for corresponding International Patent Application No. PCT/US2023/084466 dated Apr. 24, 2024, 15 pages.
Syed, Haider et al., "High Frequency Magnetic Toroidal Core Loss Measurement Fixture", 2013 Twenty-Eighth Annual IEEE Applied Power Electronics Conference and Exposition (APEC), pp. 2466-2473. Retrieved on Mar. 13, 2024 from the Internet—https://ieeexplore.ieee.org/abstract/document/6520642.

* cited by examiner

*Primary Examiner* — Christopher P McAndrew
(74) *Attorney, Agent, or Firm* — Wolf, Greenfield & Sacks, P.C.

(57) ABSTRACT

In accordance with at least one aspect of this disclosure, a system for characterizing core loss for an electronic component can include a core loss module coupleable to a current source, the core loss module including a nest configured to receive the device under test (DUT). In certain embodiments, the system can include an electronic device configured to receive output corresponding to the core loss module and configured to perform at least one operation to determine one or more of core loss, inductance, or permeability associated with the DUT.

20 Claims, 17 Drawing Sheets

GND

103

Current
Source

R1

R2

C1

CT

104b

100

105b

105b 2-pin CT

100

Pin 1: Sense          Pin 2: Sense
                              GND

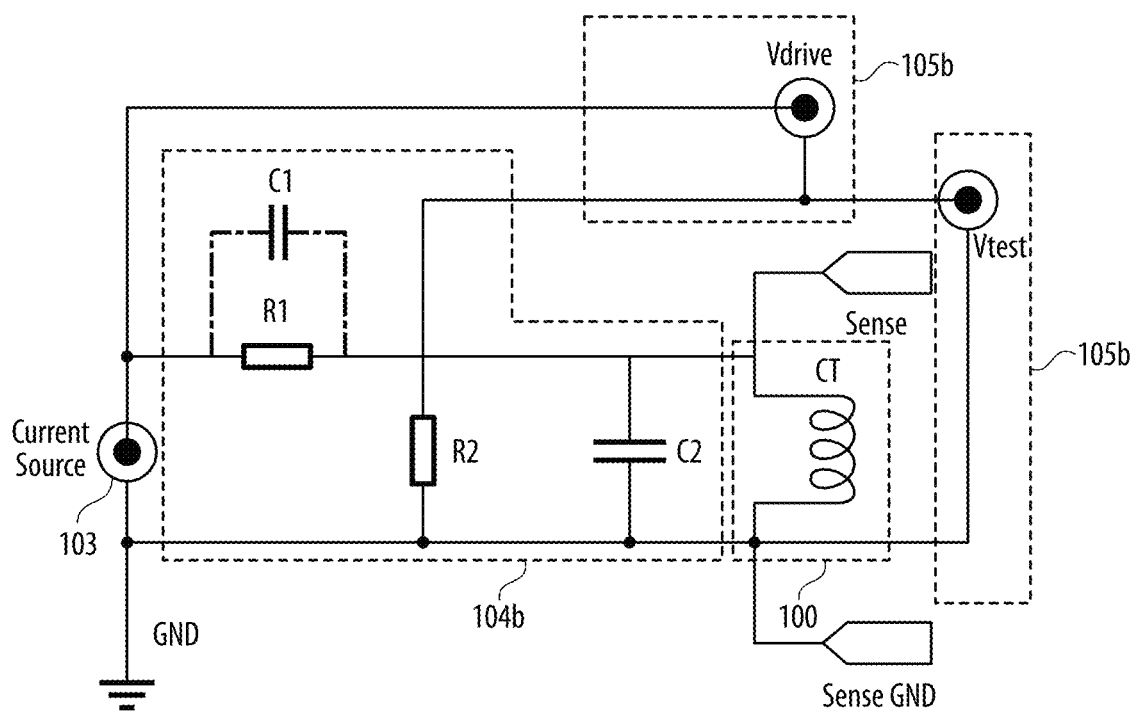
FIG. 4B
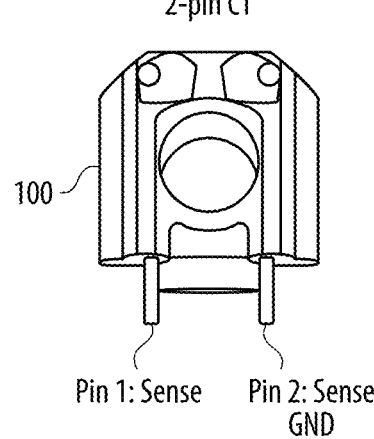
2-pin CT
100
Pin 1: Sense　　Pin 2: Sense
　　　　　　　　　　　GND Engineering Tester DUT Nest Concept Core Loss Sweep - 2500 Hz Core Loss Sweep - 1900 Hz Core Loss Sweep - 3100 Hz 310: To the left of resonant point
311: Resonant point
312: To the right of resonant point

DEVICE AND CORE LOSS CHARACTERIZATION METHOD FOR SCREENING CIRCUIT BREAKER SENSORS

CROSS-REFERENCE TO RELATED APPLICATIONS

This application claims priority to and the benefit of U.S. Provisional Application No. 63/436,456, filed Dec. 30, 2022, the entire contents of which are herein incorporated by reference in their entirety.

FIELD

This disclosure relates to core loss determination for electronic components. More specifically, this disclosure relates to apparatuses, systems, and methods for characterizing core loss for current transformers (CTs).

BACKGROUND

In conventional systems in industry, magnetic core manufacturers commonly provide information regarding the properties of the magnetic core that can be used in transformers. For this, a sample toroid, wrapped with turns of wire to achieve a desired flux density is used. This device is excited with an alternating current (AC) waveform signal and its properties are characterized. To find core losses, common techniques include the calorimeter method, or a direct winding measurement, obtaining the core losses properties in terms of Watts/volume. However, existing systems suffer problems associated with mitigating ground-neutral inconsistent detection under handle rated load conditions, such as rejection of current transformers with high core losses. Error handling is also difficult and there is low reliability for existing systems. Furthermore, existing system require a dedicated printed circuit board for characterizing core losses of a current transformer.

Such conventional methods and systems have generally been considered satisfactory for their intended purpose. However, there is still a need in the art for improvements. This disclosure provides a solution for this need.

SUMMARY

In accordance with at least one aspect of this disclosure, a system for characterizing core loss for an electronic component can include a core loss module coupleable to a current source, the core loss module including a nest configured to receive the device under test (DUT). In certain embodiments, the system can include an electronic device configured to receive output corresponding to the core loss module and configured to perform at least one operation to determine one or more of core loss, inductance, or permeability associated with the DUT.

In certain embodiments, the core loss module further includes a resonant circuit. In certain embodiments, the resonant circuit can be between the current source and the DUT.

In certain embodiments, the core loss module further includes a signal conditioning module. In certain embodiments, the core loss module further includes a data acquisition (DAQ) module. In certain embodiments, the signal conditioning module can be connected to the resonant circuit downstream of the resonant circuit and to the DUT downstream of the DUT to receive signals from the resonant circuit and the DUT. In certain embodiments, the signal conditioning module is connected to the DAQ module to send conditioned signals to the DAQ module.

In certain embodiments, the system can further include an impedance measurement device coupleable between the core loss module and to the electronic device to receive output signals from the DUT and to send impedance measurement signals to the electronic device. In certain embodiments, the system can further include a digital multimeter coupleable to the core loss module and to the electronic device to receive output signals from the DUT and to send multimeter measurement signals to the electronic device.

In certain embodiments, the system can include the current source. In certain embodiments, the system can include the DUT. In certain embodiments, the DUT can be a current transformer (CT).

In accordance with at least one aspect of this disclosure, a nest for a core loss module can include a first housing having a first recess configured to receive a first portion of a device under test (DUT), a second housing moveably connected to the first housing and having a second recess configured to receive a second portion of the DUT to retain the DUT to the first housing in a closed state, and a latch operatively connected to the first housing and the second housing. The latch can be configured to releasably latch the second housing to the first housing in a closed state.

In certain embodiments, the first housing can include one or more terminal connections configured to electrically communicate with one or more DUT terminals when the DUT is disposed in the first recess. In certain embodiments, the first recess can include a conformal shape to the DUT. In certain embodiments, the first recess can include one or more terminal alignment features configured to align the one or more DUT terminals to the one or more terminal connections.

In certain embodiments, the nest can further include a hinge connecting the second housing to the first housing. In certain embodiments, the hinge can be disposed on an opposite side relative to the latch. In certain embodiments, the first housing can include a signal output connection connected to the one or more terminal connections and configured to connect to an external device.

According to further aspects of this disclosure, provided is a method for characterizing core loss for an electronic component. The method includes connecting the electronic component to a nest of a testing system, providing a reference current from a current source to a resonant circuit, providing current to the device under test using an output of the resonant circuit, obtaining testing data from the nest, providing testing data to a signal conditioning module, transmitting output data to an electronic device, the output data corresponding to the testing data, and calculating one or more of a core loss value, an inductance value, or a permeability value based at least in part upon the output data. The method may include transmitting at least a portion of the testing data to an impedance meter and to a digital multimeter, providing impedance data corresponding to the at least a portion of the testing data to the electronic device from the impedance meter, and providing signal data corresponding to the at least a portion of the testing data to the electronic device from the digital multimeter.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 4B illustrates a circuit schematic for an embodiment of a two-pin current transformer core loss determination system according to aspects of this disclosure, shown without a signal chain (e.g., buffers), and showing an embodiment of a two-pin current transformer (CT) as an example.

DETAILED DESCRIPTION

Figure 1:
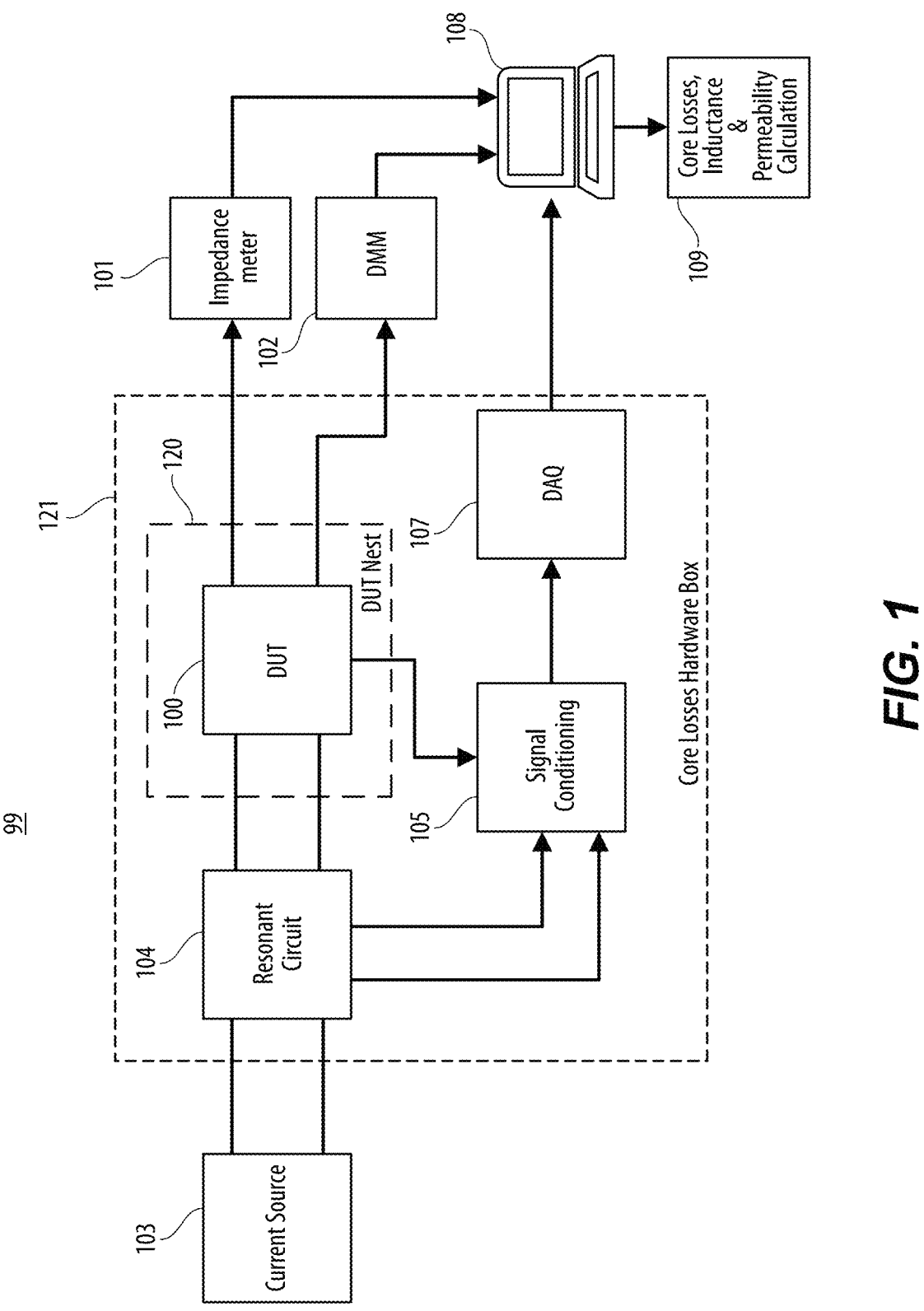
FIG. 1 illustrates a partial block diagram of an embodiment of a system for determining core losses for a device according to aspects of this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other views, embodiments, and/or aspects of this disclosure are illustrated in FIGS. 2-13B.

Aspects of this disclosure may provide apparatuses, systems, and methods for screening electronic components. For example, certain embodiments provided herein are apparatuses, systems, and methods for core loss characterization and screening for current transformers.

Certain embodiments can utilize a generic testing board for testing core losses of a CT DUT thereby increasing core loss test reliability and reducing engineering support to sort tester issues. According to aspects of this disclosure, core losses (e.g., in terms of a resistor $\Omega$ value) for a magnetic core can be calculated. A testing device can be connected to a DUT using a generic resonant test circuit and the testing system can be excited with a controlled alternating current (AC) current. Certain embodiments can be used to mitigate ground-neutral inconsistent detection under handle rated load conditions (e.g., rejection of CTs with high core losses).

FIG. 1 illustrates an embodiment of a partial block diagram of an embodiment of a system 99 for determining core losses for a device according to aspects of this disclosure. The system can include a current source 103 coupled to a core loss module 121. The core loss module 121 can include a resonant circuit 104, a signal conditioning module 105 (e.g., a signal conditioning circuit), a data acquisition module (DAQ) 107, and a nest 120 (e.g., a device under test (DUT) nest) coupleable to a DUT 100. The core loss module 121 may be coupled to an impedance meter 101, a DMM 102 (e.g., digital multimeter), and/or a computing element 108. The computing element 108 may be configured to perform one or more core loss, inductance, and/or permeability calculations and to selectively output one or more corresponding sets of data.

In certain embodiments, the resonant circuit 104 can be between the current source and the DUT 100. In certain embodiments, the signal conditioning module 105 can be connected to the resonant circuit 104 downstream of the resonant circuit 104 and to the DUT 100 downstream of the DUT 100 to receive signals from the resonant circuit 104 and the DUT 100. In certain embodiments, the signal conditioning module 105 is connected to the DAQ module 107 to send conditioned signals to the DAQ module 107.

In certain embodiments, the impedance measurement device 101 can be connected between the core loss module 121 and to the electronic device 108 to receive output signals from the DUT 100 and to send impedance measurement signals to the electronic device 108. In certain embodiments, the digital multimeter can be connected to the core loss module 121 and to the electronic device 108 to receive output signals from the DUT 100 and to send multimeter measurement signals to the electronic device 108.

In certain embodiments, the system 99 can include the current source 103. In certain embodiments, the system 99 can include the DUT 100. In certain embodiments, the DUT 100 can be a current transformer (CT).

Figure 2:
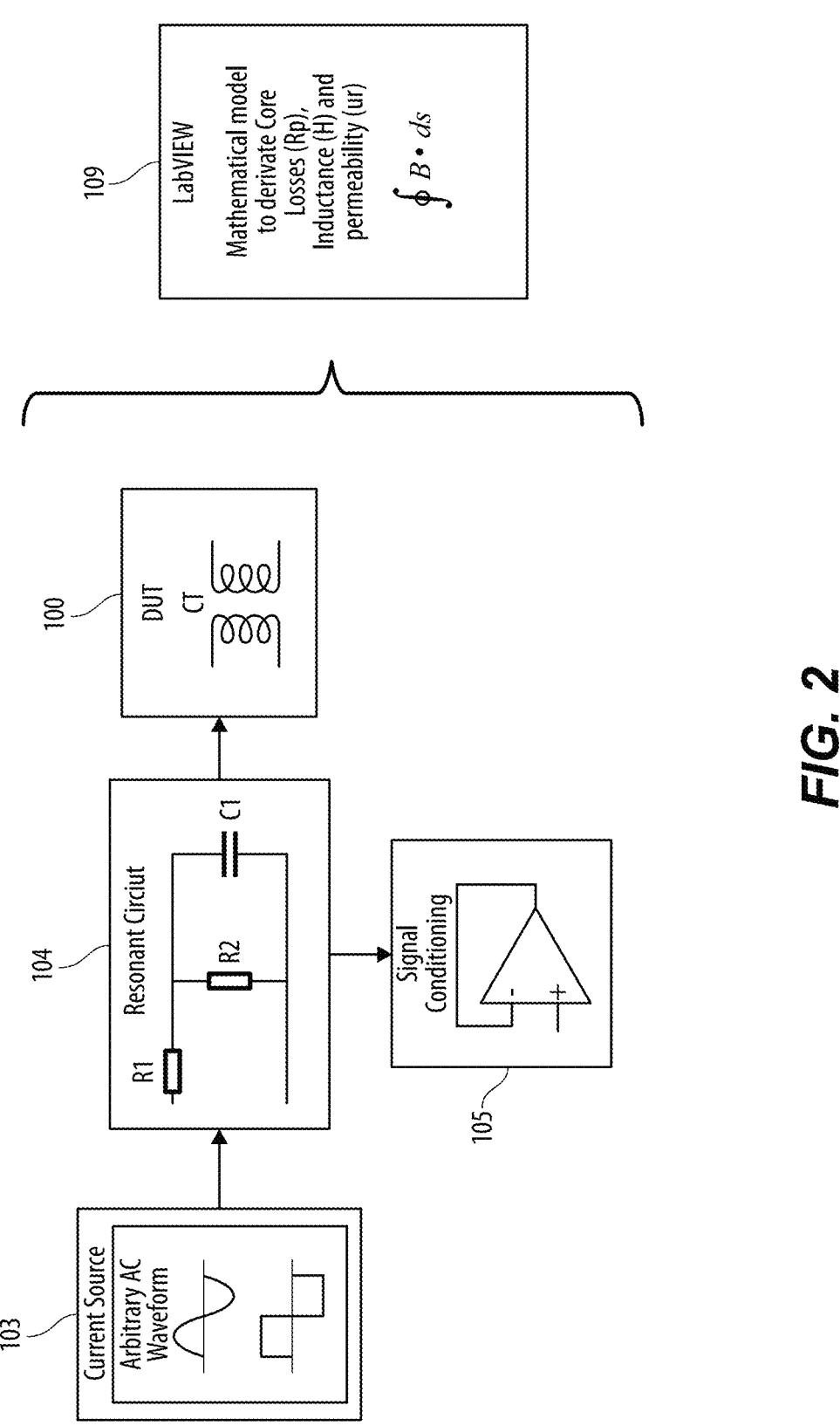
FIG. 2 illustrates a simplified block diagram of an embodiment of a system for calculating core losses, inductance, and permeability for a device according to aspects of this disclosure.

FIG. 2 illustrates an embodiment of a simplified block diagram of an embodiment of a system for calculating core losses, inductance, and permeability for a device according to aspects of this disclosure. In certain embodiments, the system includes a current source 103 configured to output an AC output to a resonant circuit 104. The resonant circuit may include a resistor R1, a resistor R2, and a capacitor C1. The resonant circuit 104 may be coupled to a signal conditioning module 105 and a DUT 100 (e.g., a CT). A calculation module 109 may include one or more algorithms and/or electronic components configured to perform one or more calculations corresponding to the one or more algorithms to implement a mathematical model to derive core losses (Rp), inductance (H), and/or permeability (ur).

Figure 3A:
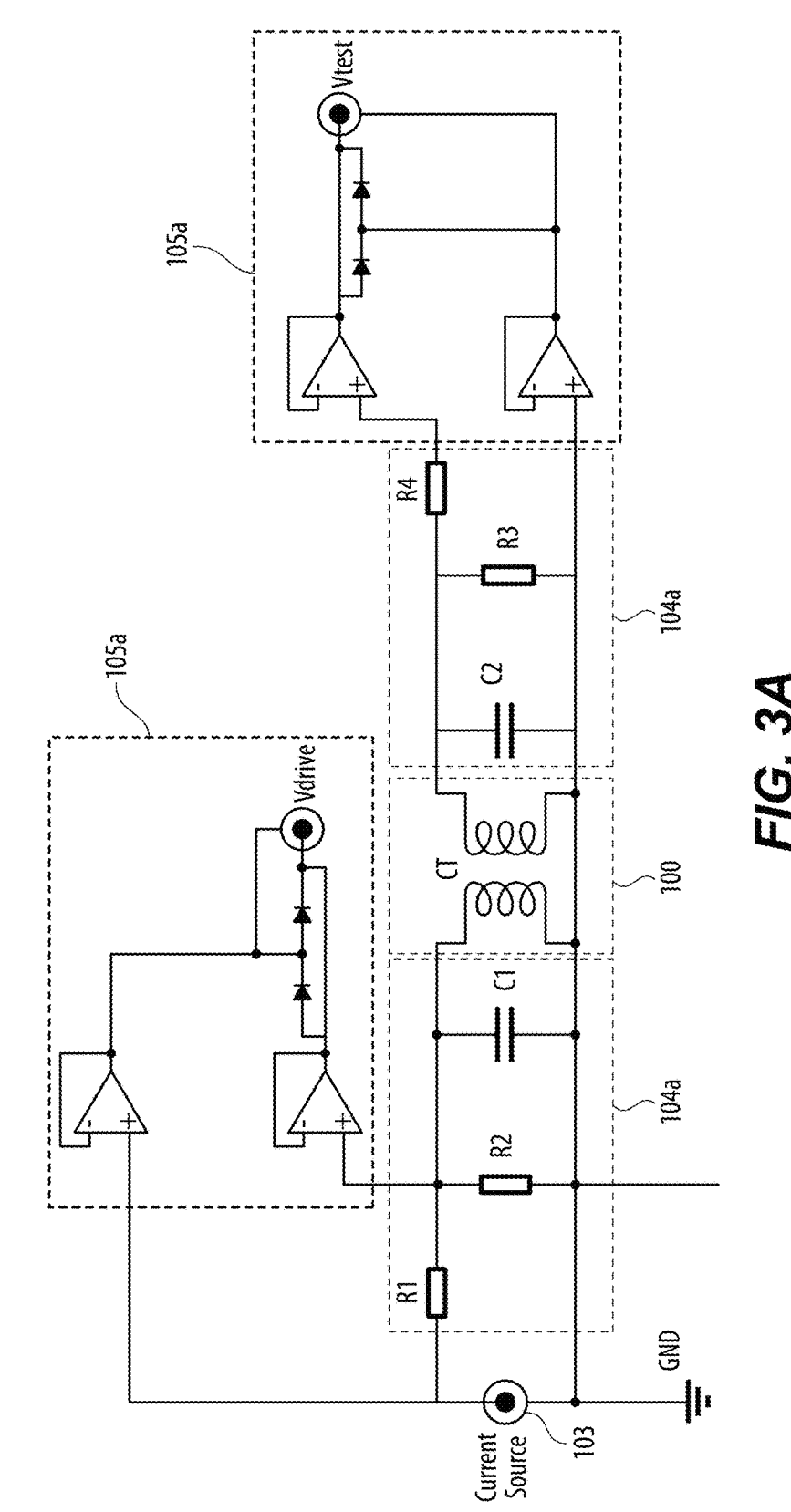
FIG. 3A illustrates a circuit schematic for an embodiment of a four-pin current transformer core loss determination system according to aspects of this disclosure, shown having a signal chain (e.g., buffers), showing an embodiment of a four-pin current transformer (CT) as an example.
Figure 3B:
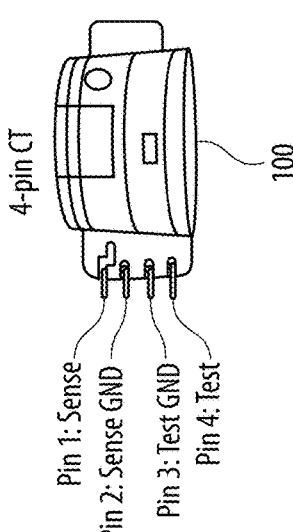
FIG. 3B illustrates a circuit schematic for an embodiment of a four-pin current transformer core loss determination system according to aspects of this disclosure, shown without a signal chain (e.g., buffers), showing an embodiment of a four-pin current transformer (CT) as an example.
Figure 3B:
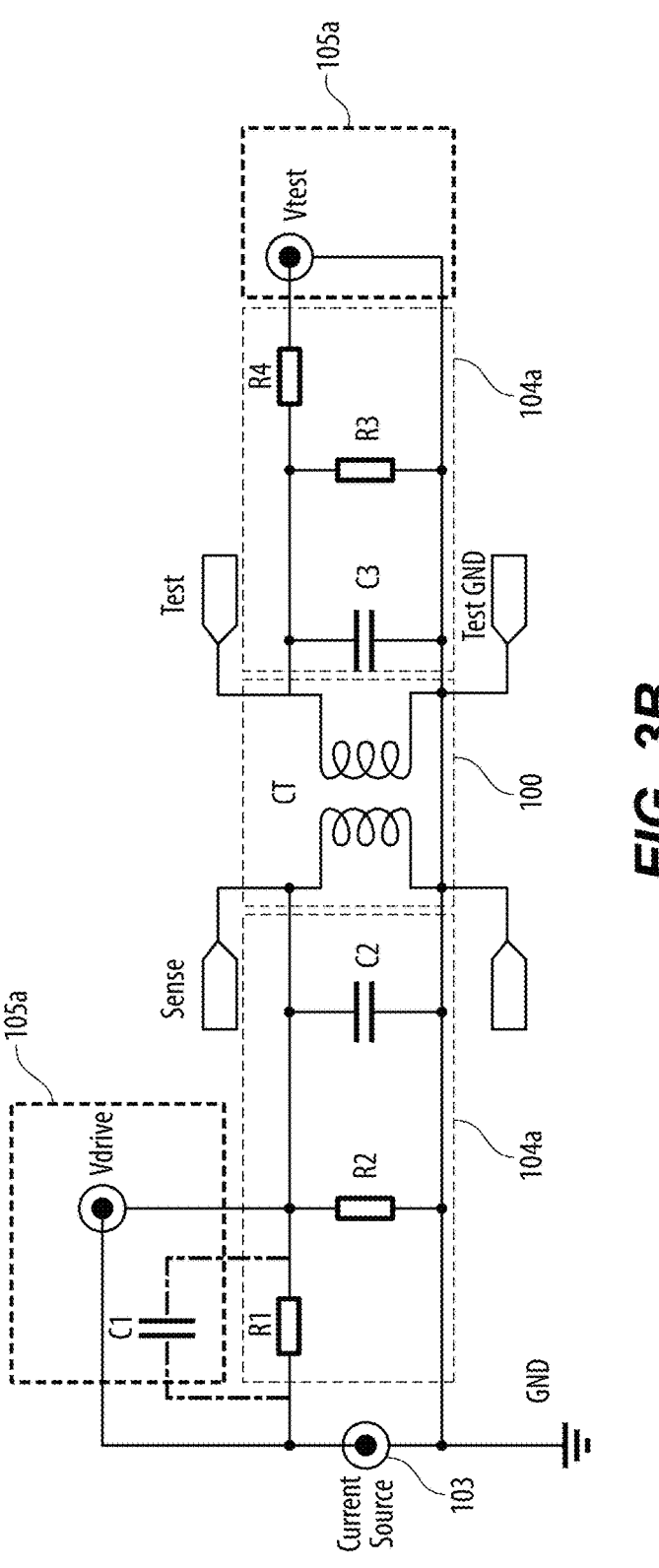
Figure 4A:
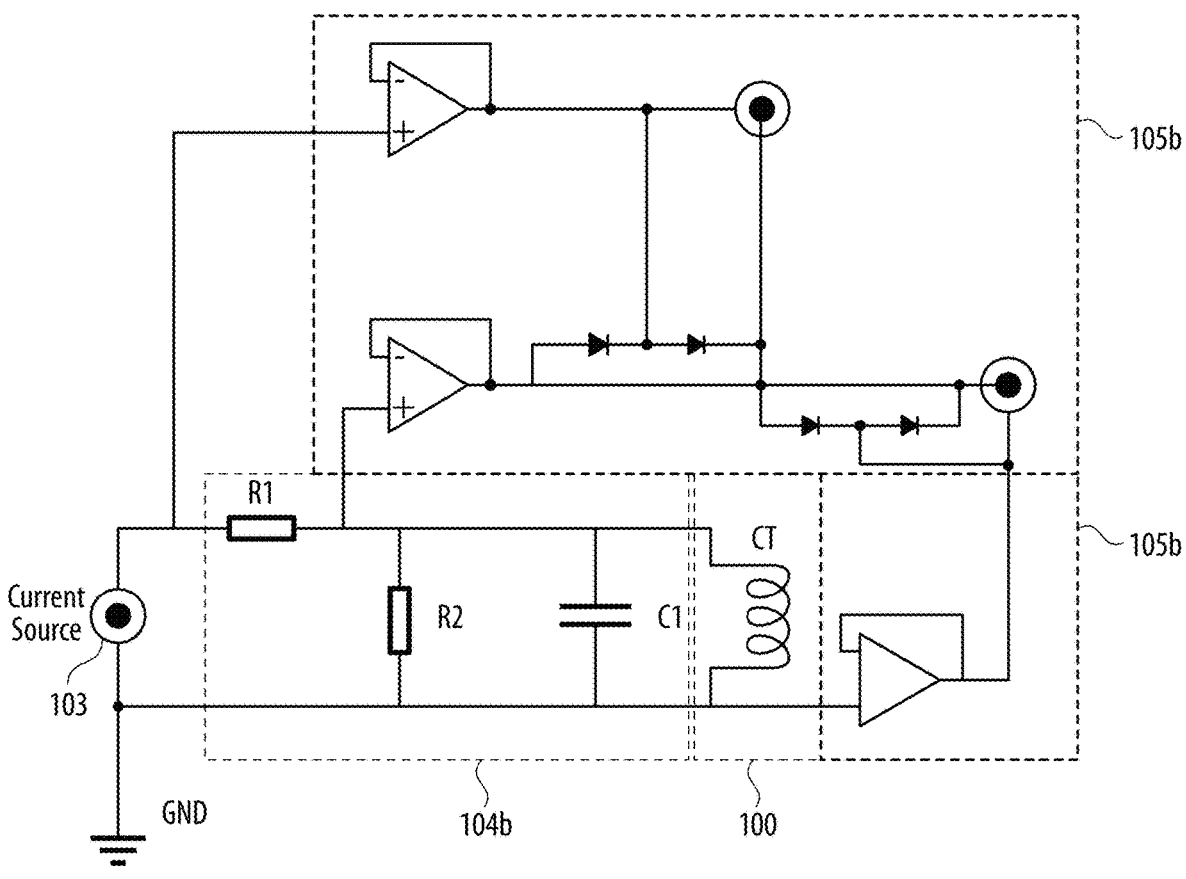
FIG. 4A illustrates a circuit schematic for an embodiment of a two-pin current transformer core loss determination system according to aspects of this disclosure, shown having a signal chain (e.g., buffers), and showing an embodiment of a two-pin current transformer (CT) as an example.
Figure 4A:
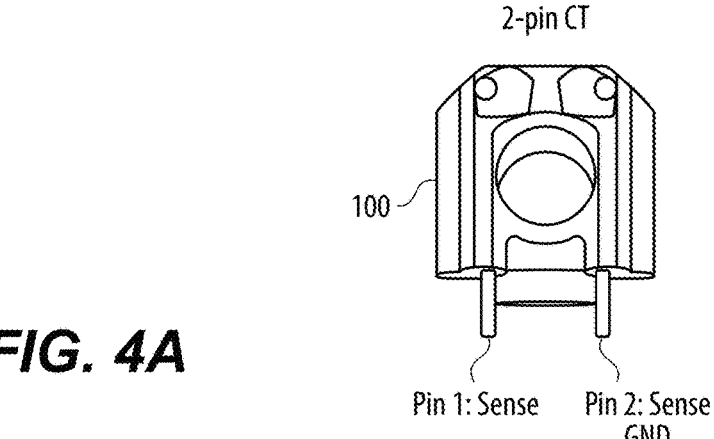

FIGS. 3A and 3B illustrate an embodiment of a circuit schematic for an embodiment of a four-pin current transformer core loss determination system according to aspects of this disclosure. In certain embodiments, the circuit includes the current source 103 coupled to the resonant circuit 104a which is coupled to a first winding of the DUT 100 and to a signal conditioning circuit 105a. In certain embodiments, a resonant circuit 104a is coupled to a second winding of the DUT 100 and is further coupled t to a signal conditioning circuit 105a. The embodiment of FIG. 3A is shown having a signal chain (e.g., buffers) and illustrates an embodiment of a four-pin current transformer (CT) as the DUT 100, for example. The embodiment of FIG. 3B is shown without a signal chain (e.g., buffers). FIGS. 4A and 4B illustrate an embodiment of a circuit schematic for an embodiment of a two-pin current transformer core loss determination system according to aspects of this disclosure. In certain embodiments, the circuit includes the current source 103 coupled to a resonant circuit 104b and to a signal conditioning circuit 105b. In certain embodiments, a DUT 100 is coupled to the resonant circuit 104b and a signal conditioning circuit 105b. The embodiment of FIG. 4A is shown having a signal chain (e.g., buffers) and illustrates an embodiment of a two-pin current transformer (CT) as the DUT 100, for example. The embodiment of FIG. 4B is shown without a signal chain (e.g., buffers).

Figure 5A:
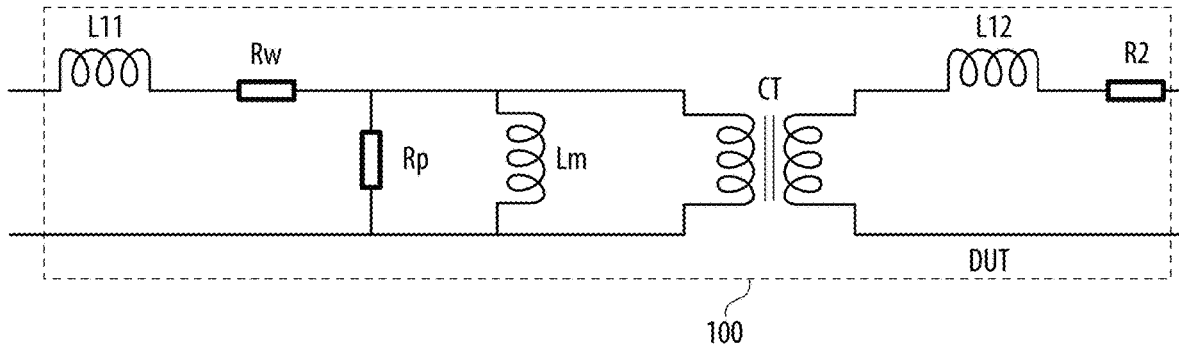
FIG. 5A illustrates a partial circuit schematic for an embodiment of a four-pin current transformer core loss determination system according to aspects of this disclosure.
Figure 5B:
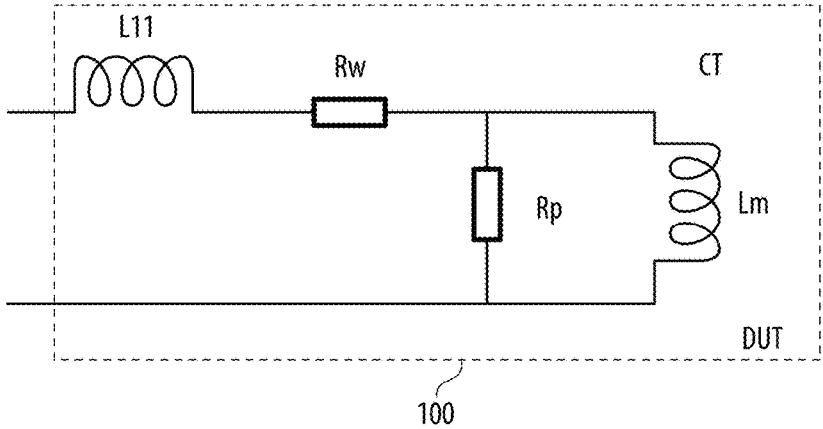
FIG. 5B illustrates a partial circuit schematic for an embodiment of a four-pin current transformer core loss determination system according to aspects of this disclosure.

FIG. 5A illustrate an embodiment of a partial circuit schematic for an embodiment of a four-pin current transformer core loss determination system according to aspects of the present disclosure. FIG. 5B illustrates a partial circuit schematic for an embodiment of a four-pin current transformer core loss determination system according to aspects of the present disclosure. As reflected in FIGS. 5A-B, Rp relates to core losses (Ω), Rw relates to sense winding resistance (Ω), R2 relates to test winding resistance (Ω), Lm relates to magnetizing inductance (H), L11 relates to sense leakage inductance (H), and L12 relates to test leakage inductance (H).

Figures 6A, 6B:
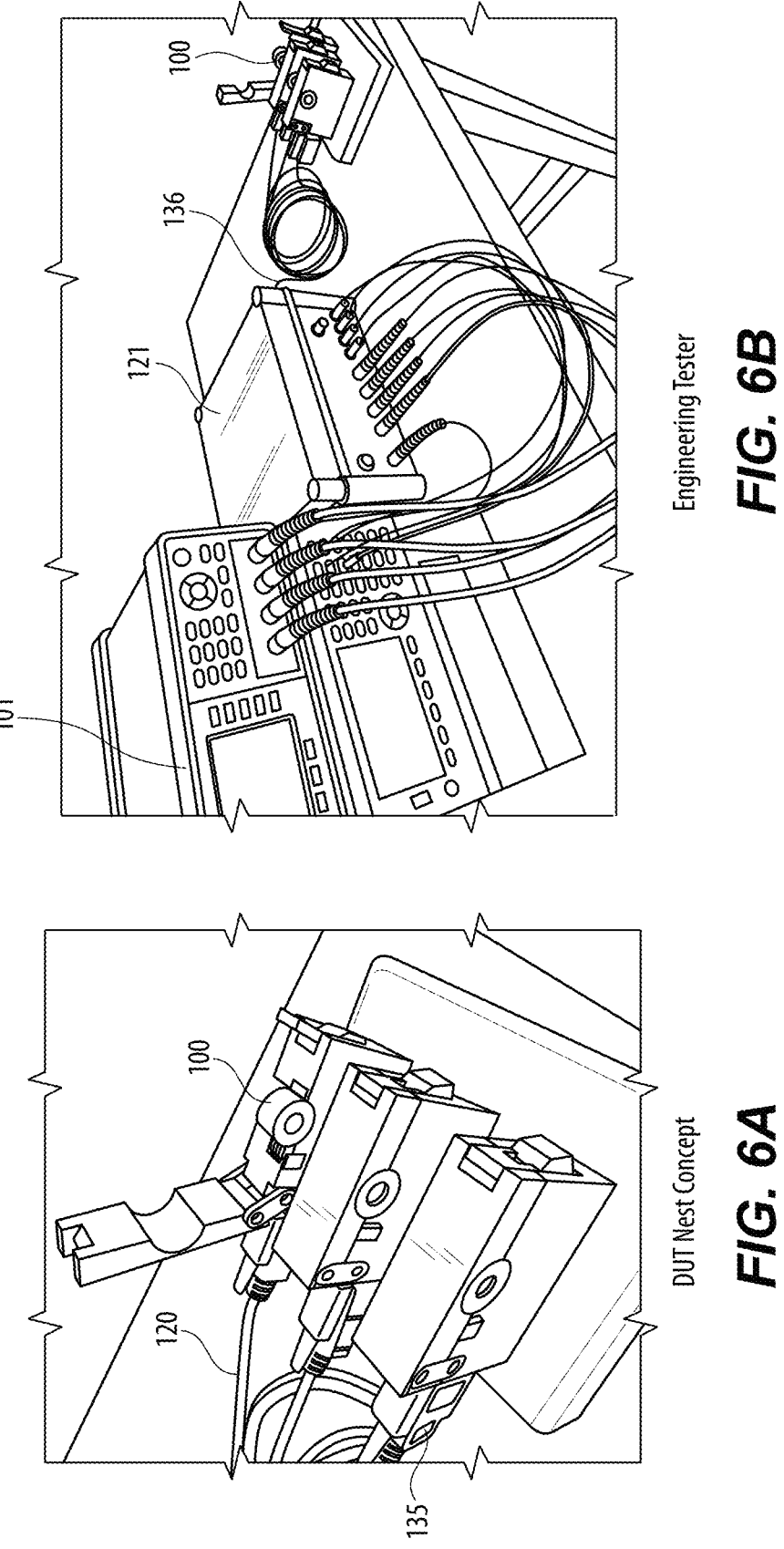
FIG. 6A is a perspective view of an embodiment of a device under test (DUT) nest assembly in accordance with this disclosure.
FIG. 6B is a perspective view of an embodiment of an engineering tester according to aspects of this disclosure.
Figures 7A, 7B, 7C, 7D:
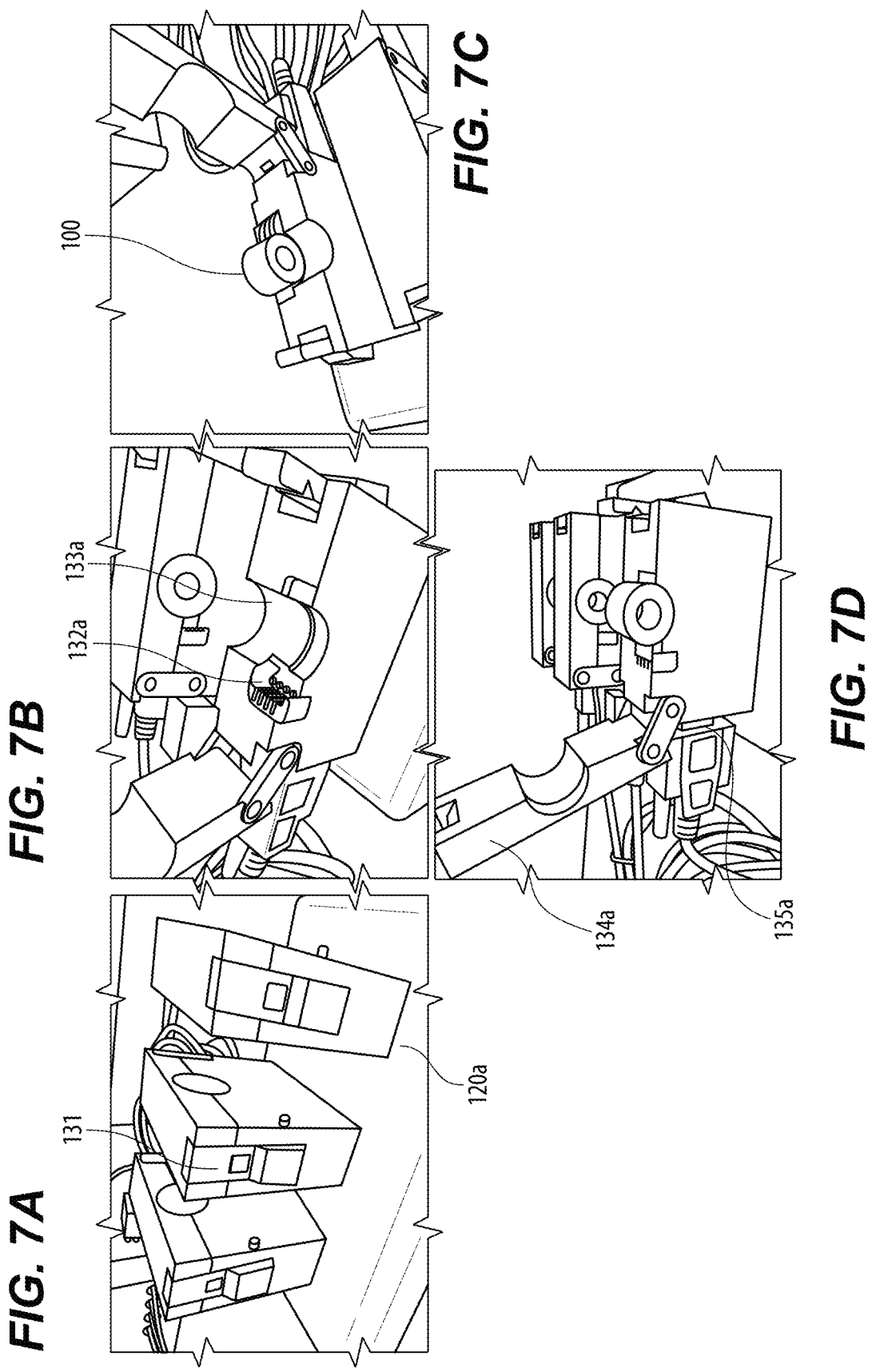
FIG. 7A is a perspective view of an embodiment of a nest core loss detection device according to aspects of this disclosure, shown in a closed position.
FIG. 7B is a perspective view of the embodiment of FIG. 7A, shown in an open position without a current transformer (CT) disposed therein.
FIG. 7C is a perspective view of the embodiment of FIG. 7A, shown in an open position and having a current transformer (CT) disposed therein.
FIG. 7D is another perspective view of the embodiment as shown in FIG. 7C.
Figures 8A, 8B:
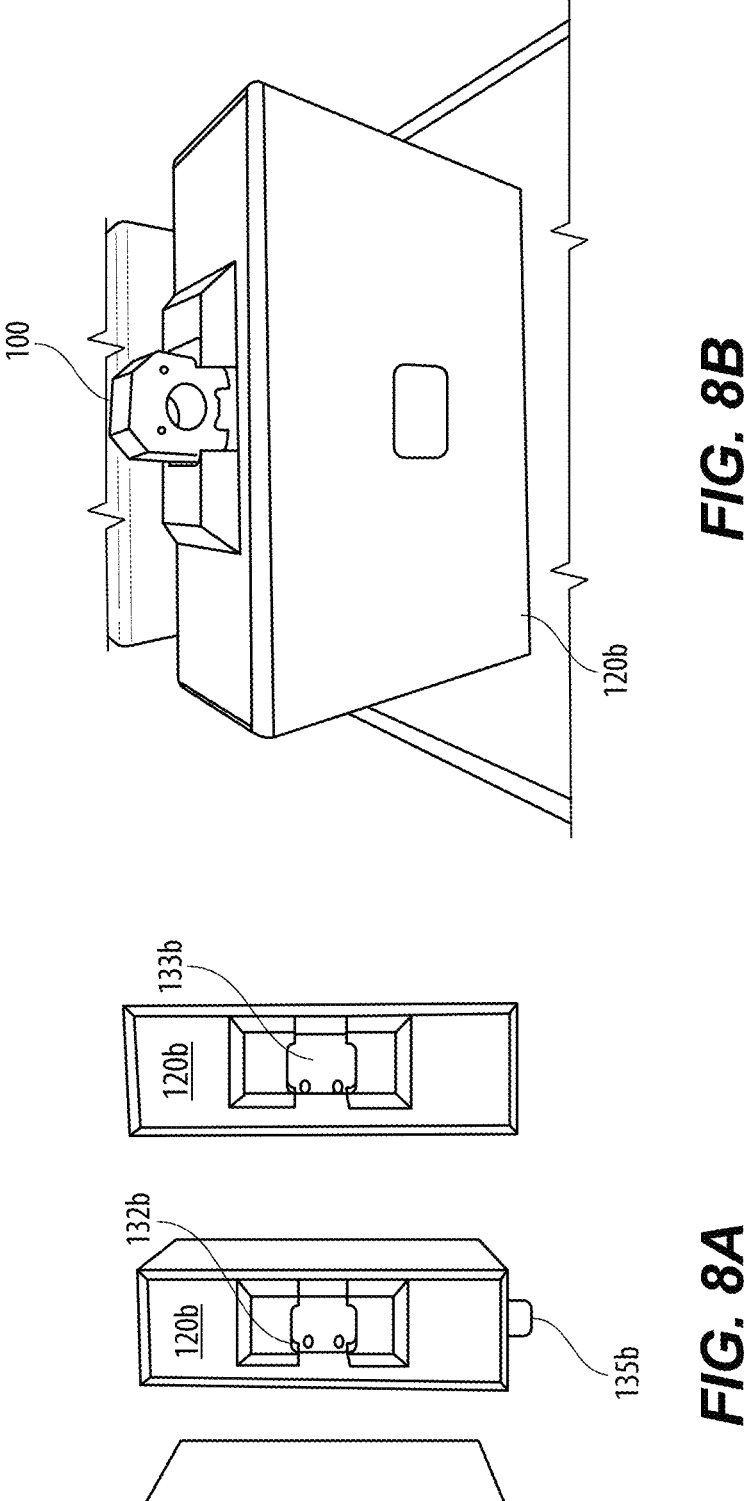
FIG. 8A is a plan view of an embodiment of a two-pin nest core loss detection device arrangement according to aspects of this disclosure, shown without a CT therein.
FIG. 8B is a perspective view of the embodiment of FIG. 8A, shown with a CT disposed therein.

FIGS. 6A and 6B illustrate a plurality of an embodiment of a device under test (DUT) nest 120 (e.g., shown in isolation in FIGS. 12A-13B) and an engineering tester according to aspects of this disclosure. FIGS. 7A, 7B, 7C, and 7D illustrates an embodiment of a four-pin nest core loss detection device according to aspects of the present disclosure. A nest 120 may be coupled to a DUT 100 and at least one connectors 135 may be coupled to a nest 120 and may be configured to transfer one or more signal via one or more conductors 136. As illustrated by FIGS. 6A and 6B, a plurality of nests 120 may be coupleable to a current source 103 and/or additional element(s) without departing from the spirit and scope of this disclosure. The nest 120 may be a two-pin (e.g., nest 120b as shown in FIGS. 8A and 8B), a four-pin nest (e.g., nest 120a shown in FIGS. 7A-7D), or any other pin configuration nest.

A lid/nest locking mechanism 131 may be implemented at the nest 120, for example a four-pin lid/nest locking mechanism. One or more pin clips 132a may be used to attach to one or more pins of a CT (e.g., DUT 100). A space 133a may be implemented at a nest 120 to allocate room for a CT, such as a DUT 100. A lid 134a may be provided at the nest 120. One or more signal connectors 135a may be coupleable to a nest 120. FIGS. 8A and 8B illustrate an embodiment of a two-pin nest core loss detection device 820 according to aspects of this disclosure. A two-pin nest 120b may include pin clips 132b to attach to one or more CT pins (e.g., pins of a DUT 100). A space 133b may be provided to allocate room for a CT (e.g., a DUT 100). One or more signal connectors 135b may be coupleable to a nest 120.

Figures 9A, 9B:
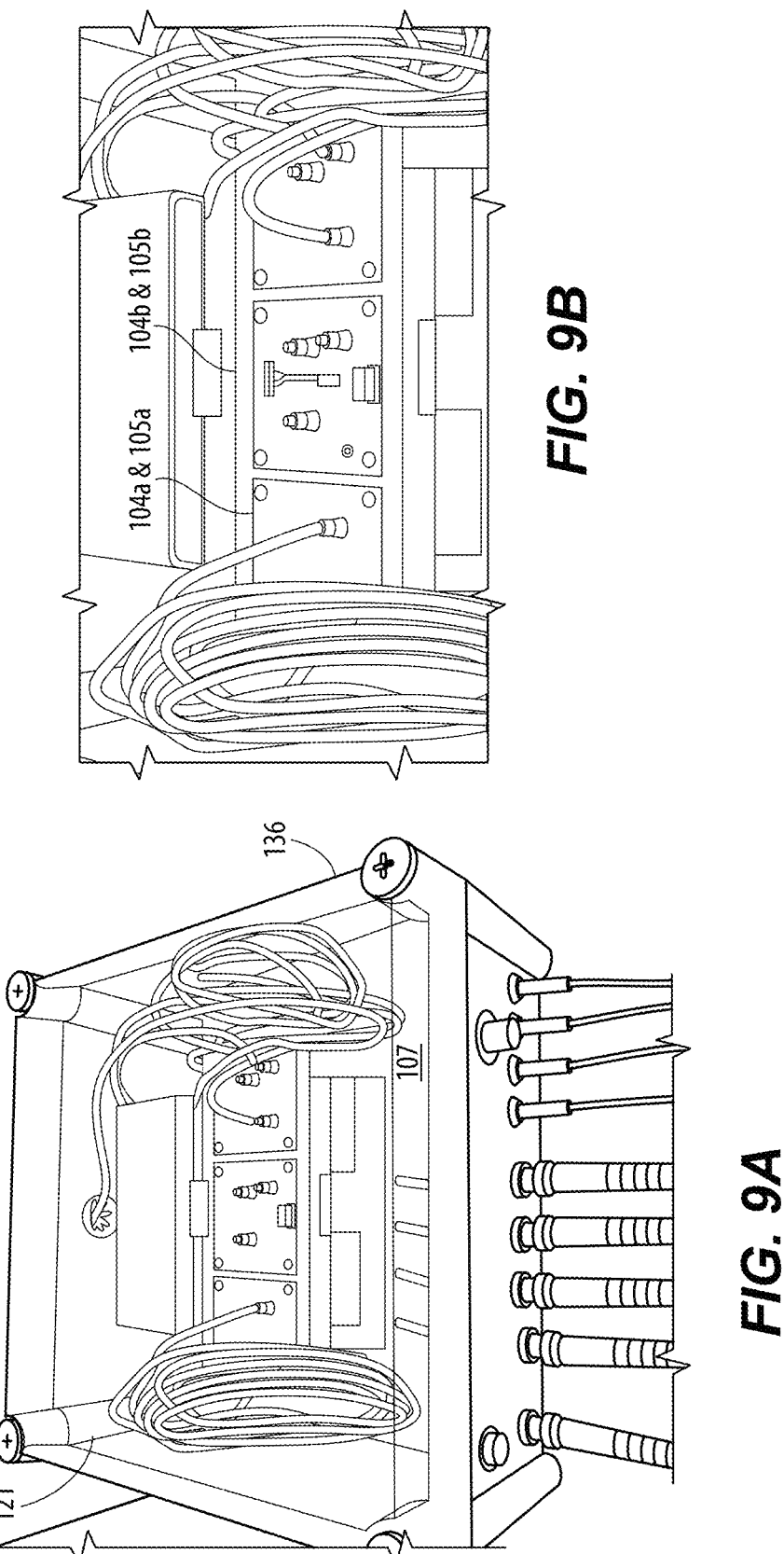
FIG. 9A illustrates an embodiment of hardware useable for a core loss detection system according to aspects of this disclosure.
FIG. 9B is a close up of a circuit assembly of the embodiment of FIG. 9A.

FIGS. 9A and 9B illustrate an embodiment of hardware useable for a core loss detection system according to aspects of this disclosure. FIGS. 9A and 9B illustrate an example of a core loss module 121, for example as illustrated and described above with reference to FIG. 1, shown without a nest 120.

Figure 10A:
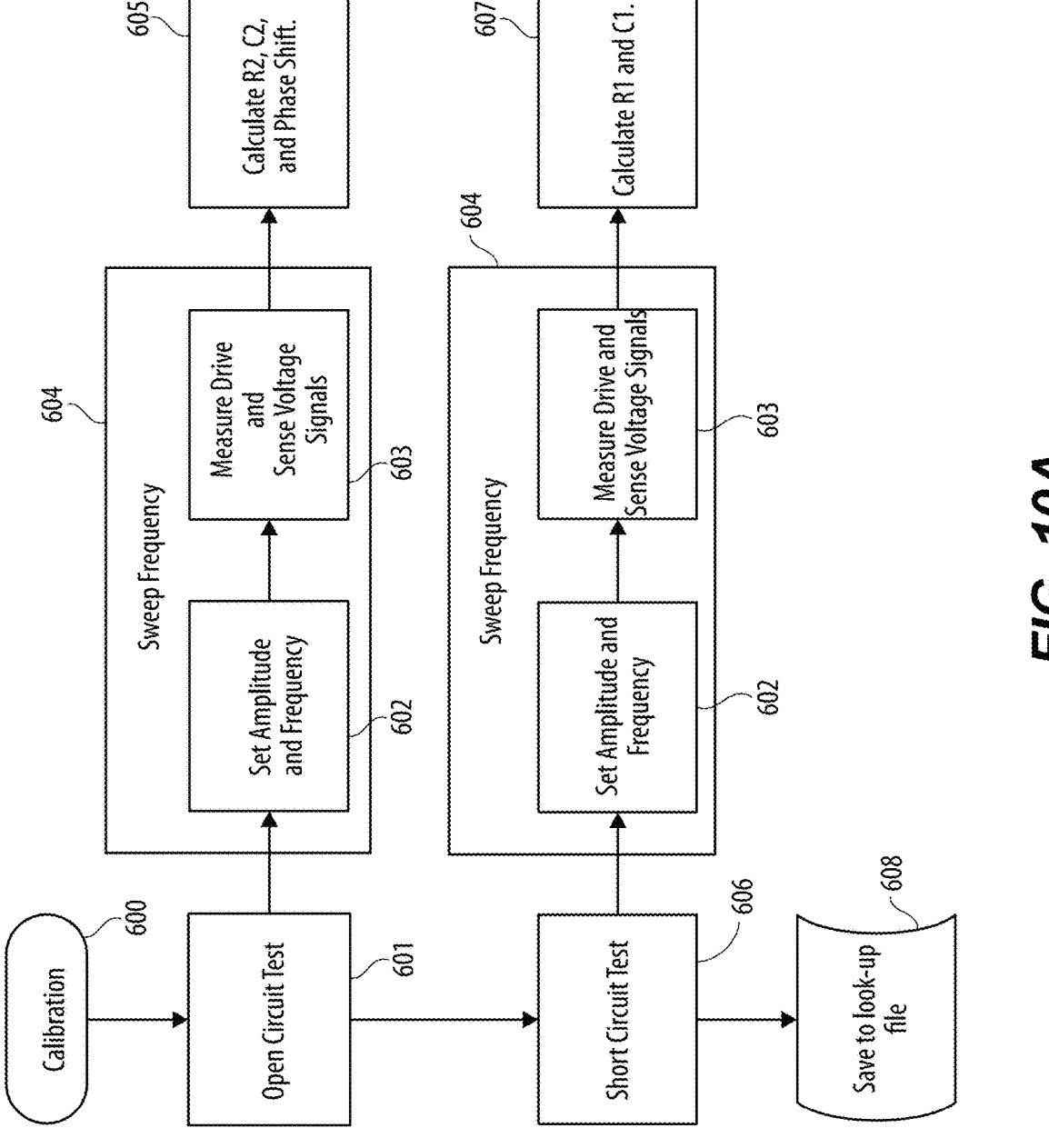
FIG. 10A illustrates an embodiment of a resonant circuit calibration procedure.

FIG. 10A illustrates an embodiment of a resonant circuit calibration procedure. In certain embodiments, the resonant circuit should be calibrated each time that the system starts (e.g., at the beginning of a sensor screening process). Such calibration can obtain the values of resistors (R1, R2), capacitor (C2), and phase shift between Vdrive and Vtest due to parasitic impedances (C1) of the resonant circuit and how these values vary versus frequency and temperature. In certain embodiments, these obtained values are inputs to the core loss calculation and the calibration procedure is key for an accurate core loss (Rp) derivation, e.g., as described below with respect to FIG. 10B.

Referring to FIG. 10A, in certain embodiments, the circuit calibration procedure 600 begins with an open circuit test (e.g., a block 601). In certain embodiments, the current source is used to set the initial amplitude and frequency to 100 Hz or other suitable frequency (e.g., at block 602). In certain embodiments, the drive and sense voltage signals are then measured (e.g., at block 603). This process can be repeated throughout a frequency sweep (e.g., at block 604). In certain embodiments, the drive and sense voltage signals are utilized to calculate the values of R2, C2, and the phase shift (e.g., at block 605).

Next, a short circuit test (e.g., at block 606) can be performed. In certain embodiments, the frequency is set to a low value of 10 Hz or other suitable low value (e.g., at block 607), and the drive and sense signals can be measured (e.g., at block 603). In certain embodiments, once the measurements are acquired, the value of R1 can be calculated (e.g., at block 607). In certain embodiments, a frequency sweep is then be executed (e.g., at block 604) to determine the value of C1 (e.g., at block 607). In certain embodiments, all calculated values can be stored in a lookup file (e.g., at block 608) for subsequent use in the main core loss program.

Figure 10B:
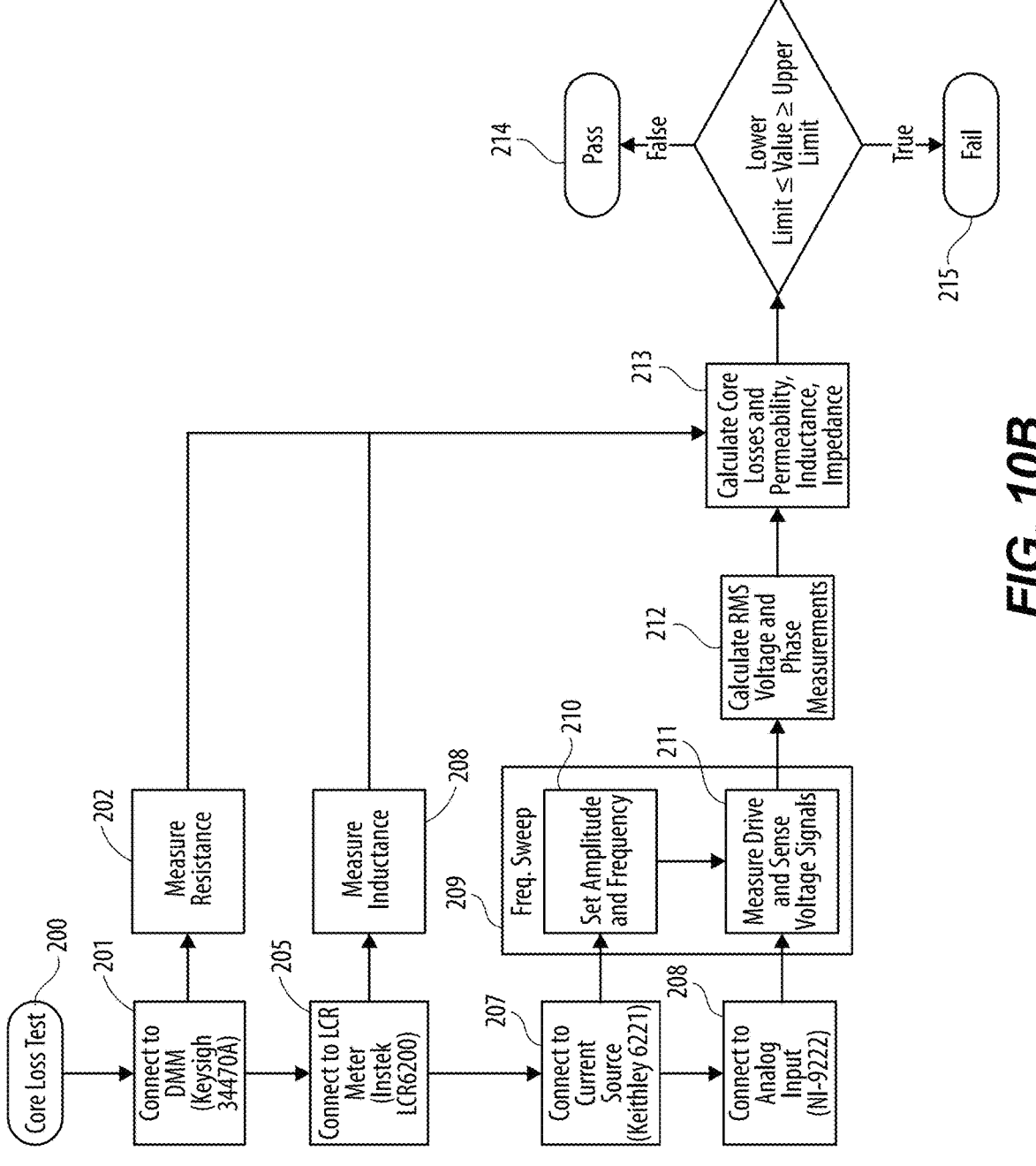
FIG. 10B illustrates an example of a process flow for determining core loss for a current transformer and a resulting output waveform according to aspects of this disclosure.
Figure 10C:
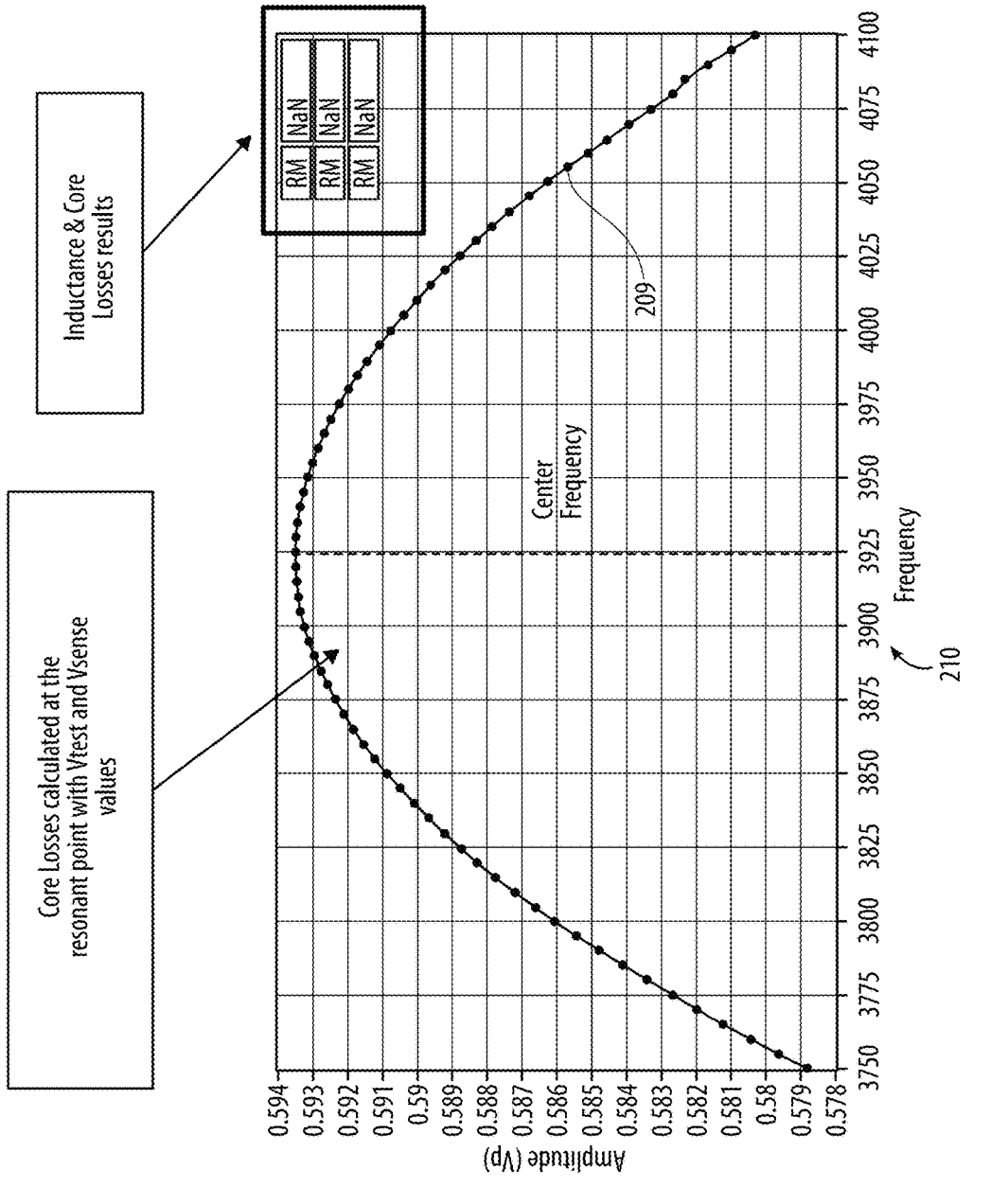
FIG. 10C illustrates a chart associated with the process of FIG. 10B, showing frequency vs. amplitude and an embodiment of a calculation point of core loss.

FIG. 10B illustrates an example of a process flow for determining core loss for a current transformer and a resulting output waveform according to aspects of the present disclosure. A core loss test process 200 can begin at an operation 201 where DMM (e.g., a Keysight 34470A) is connected to a testing system and is used to measure resistance of a DUT 100 at an operation 202. In certain embodiments, an LCR meter is connected to a testing system at an operation 205 and is used to measure an inductance associated with a DUT 100 at an operation 206. In certain embodiments, a current source (such as a Keithley 6221) is connected to a testing system at an operation 207 and an analog input (e.g., NI-9222) is connected to the testing system at an operation 209. In certain embodiments, a frequency sweep operation is performed at an operation 209 which includes setting an amplitude and frequency at an operation 210 and measuring drive and sense voltage signals at an operation 211. In certain embodiments, an RMS voltage is calculated and phase measurements are calculated at an operation 212. In certain embodiments, core losses and permeability, inductance, and impedance associated with a DUT 100 are calculated at an operation 213 using inputs from operations 202, 206, and 212. In certain embodiments, it is then determined whether the values calculated at operation 213 are above a lower limit and below an upper limit. In certain embodiments, if it is determined that the value is not within the range between the lower limit and the upper limit, the device fails at an operation 215. In certain embodiments, however, if the value is within the range between the lower limit and the upper limit, the device is passed at an operation 214. In certain embodiments, an output waveform corresponding to operation 209 mapping amplitude vs. frequency may be provided at a graph corresponding to operation 210 based at least in part upon one or more values. In certain embodiments, core losses may be calculated at the resonant point with Vtest and Vsense values in various embodiments. Inductance and core loss values may be provided. FIG. 10C illustrates a chart associated with the process of FIG. 10B, showing frequency vs. amplitude and an embodiment of a calculation point of core loss. FIG. 10C also illustrates an embodiment graphical user interface (GUI) and/or software module for determining core loss (e.g., which can reference the look up table with the calibration calculated values).

Figures 11A, 11B, 11C:
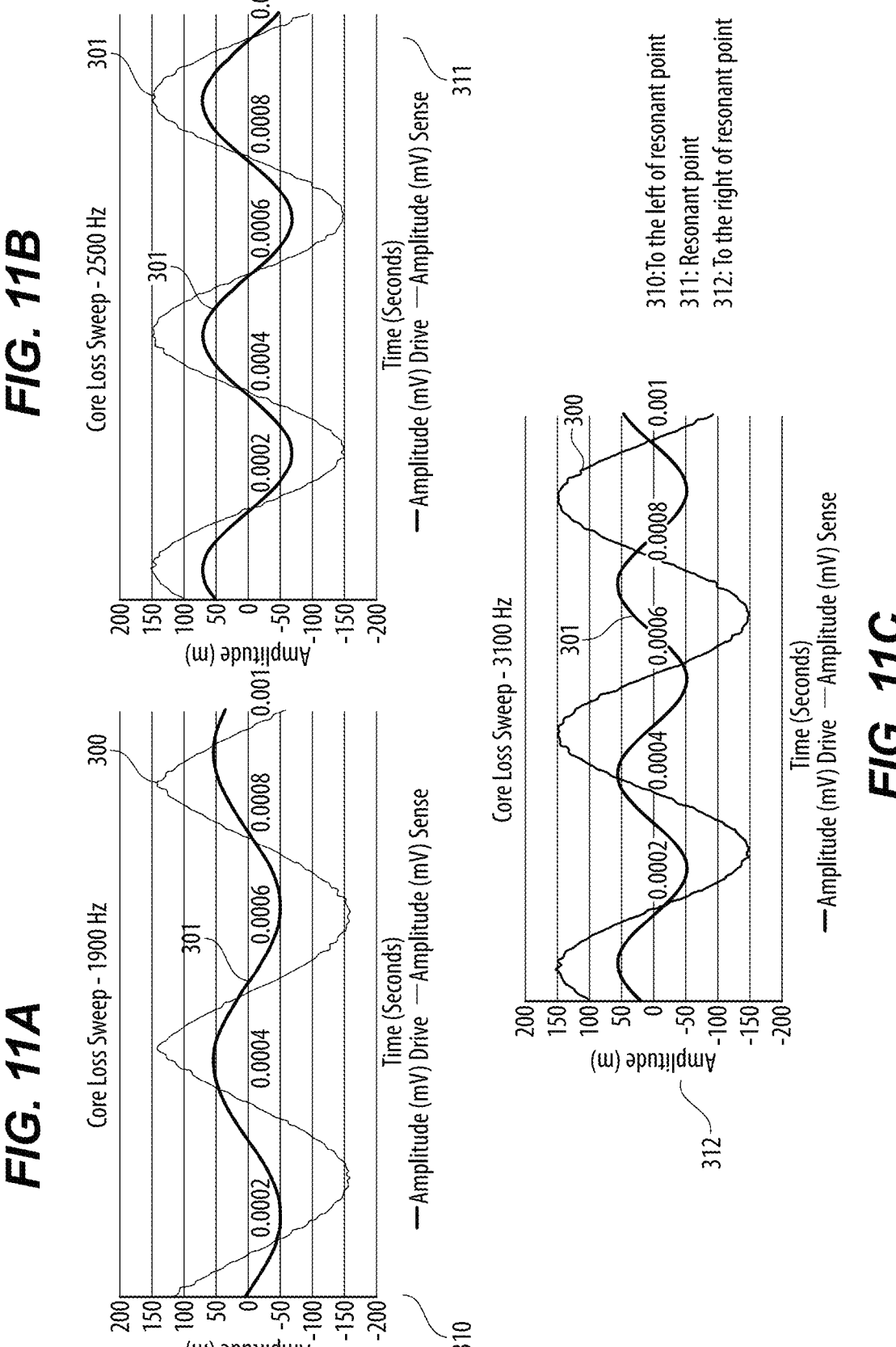
FIGS. 11A, 11B, and 11C illustrate three examples of generated waveforms during a frequency sweep operation according to aspects of this disclosure.

FIGS. 11A, 11B, and 11C illustrate three examples of generated waveforms during a frequency sweep operation according to aspects of this disclosure. Drive amplitude 301 may be compared to sense amplitude 300 in mV across time at one or more frequencies (e.g., relative to a resonant point).

Figures 12A, 12B, 12C:
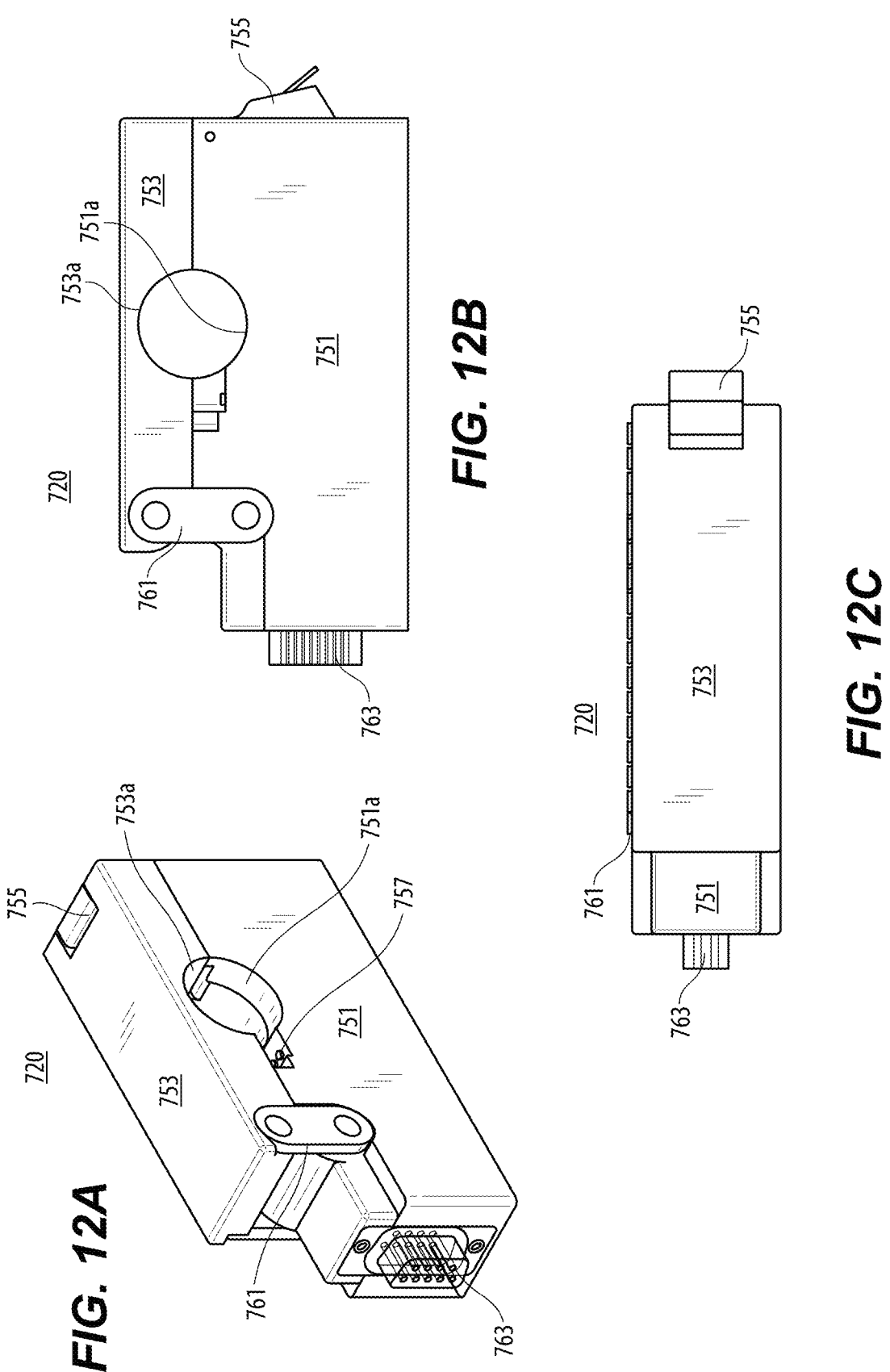
FIG. 12A is a perspective view of an embodiment of a nest in accordance with one or more aspects of this disclosure, shown in a closed position.
FIG. 12B is an elevation view of the embodiment of FIG. 12A.
FIG. 12C is a top down plan view of the embodiment of FIG. 12A.
Figure 13B:
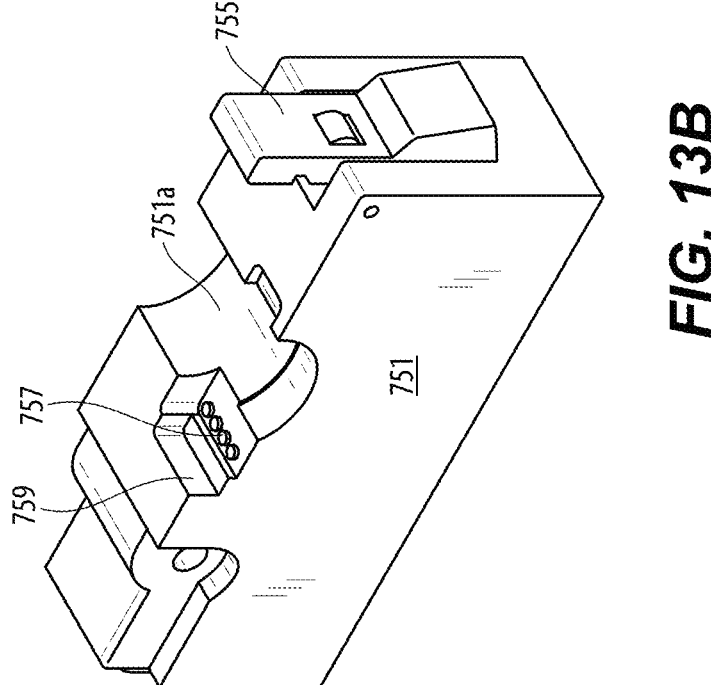
FIG. 13B is a rear perspective view of the embodiment of FIG. 13A.
Figure 13A:
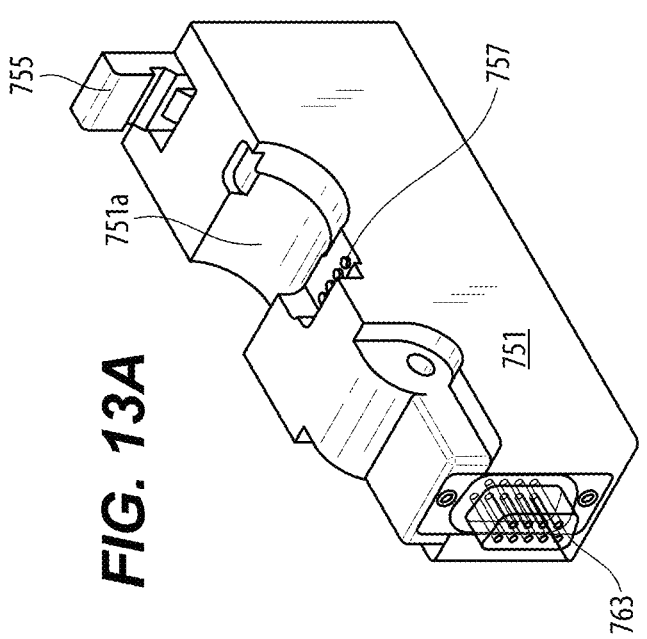
FIG. 13A is a front perspective view of the embodiment of FIG. 12A, shown without the top portion.

FIGS. 12A, 12B, and 12C illustrate raised perspective (FIG. 12A), right side (FIG. 12B), and top views (FIG. 12C) of an embodiment of a nest 720 according to aspects of this disclosure. The embodiment illustrated by FIGS. 12A-12C may be a four-pin CT nest 120 as previously described herein. FIGS. 13A and 13B illustrate raised front perspective (FIG. 13A) and rear perspective (FIG. 13B) views of a second housing portion of the embodiment of FIG. 12A.

In accordance with at least one aspect of this disclosure, as shown 12A-13B, certain embodiments of a nest 720 for a core loss module 121 can include a first housing 751 (e.g., a bottom housing) having a first recess 751a configured to receive a first portion (e.g., a bottom) of a device under test (DUT) 100. The nest 720 can include a second housing 753 (e.g., a lid as disclosed above) moveably connected to the first housing 751 and having a second recess 753a configured to receive a second portion (e.g., a top) of the DUT 100 to retain the DUT 100 to the first housing 751 in a closed state (e.g., as shown in FIGS. 12A-12C).

The nest 720 can include a latch 755 operatively connected to the first housing 751 and the second housing 753. The latch 755 can be configured to releasably latch the second housing 753 to the first housing 751 in a closed state. The latch 755 can be a hinged latch (e.g., biased in a latched direction) attached to the first housing 751 that is configured to interact with the second housing 753.

In certain embodiments, the first housing 751 can include one or more terminal connections 757 configured to electrically communicate with one or more DUT terminals (e.g., winding end connectors of a CT) when the DUT 100 is disposed in the first recess 751. In certain embodiments, the first recess 751 can include a conformal shape to the DUT 100 (e.g., a semi-cylindrical shape for a round CT). In certain embodiments, the first recess 751 can include one or more terminal alignment features 759 (e.g., one or more cutouts or channels as shown) configured to align the one or more DUT terminals to the one or more terminal connections 757.

In certain embodiments, the nest 720 can further include a hinge 761 connecting the second housing 753 to the first housing 751. In certain embodiments, the hinge 761 can be disposed on an opposite side relative to the latch 755 (e.g., as shown in FIGS. 12A-12C). In certain embodiments, the first housing 751 can include a signal output connection 763 connected to the one or more terminal connections 757 and configured to connect to an external device (e.g., core loss module 121 and/or any component thereof, impedance meter 101, digital multimeter 102, device 108, etc.).

According to aspects of this disclosure, provided is a system for characterizing core loss for an electronic component, including a device under test, a current source, a core loss module coupleable to the current source, the core loss module including a nest configured to receive the device under test, an electronic device configured to receive output corresponding to the core loss module and configured to perform at least one operation to determine one or more of core loss, inductance, or permeability associated with the device under test. The core loss module may include a resonant circuit, a signal conditioning module, and a data acquisition module. An impedance measurement device and a digital multimeter may be coupleable to the core loss module and to the electronic device.

According to further aspects of this disclosure, provided is a method for characterizing core loss for an electronic component. The method includes connecting the electronic component to a nest of a testing system, providing a reference current from a current source to a resonant circuit, providing current to the device under test using an output of the resonant circuit, obtaining testing data from the nest, providing testing data to a signal conditioning module, transmitting output data to an electronic device, the output data corresponding to the testing data, and calculating one or more of a core loss value, an inductance value, or a permeability value based at least in part upon the output data. The method may include transmitting at least a portion of the testing data to an impedance meter and to a digital multimeter, providing impedance data corresponding to the at least a portion of the testing data to the electronic device from the impedance meter, and providing signal data corresponding to the at least a portion of the testing data to the electronic device from the digital multimeter.

In the preceding, reference is made to various embodiments. However, the scope of this disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of this disclosure. Thus, the preceding aspects, features, embodiments and advantages are merely illustrative and are not considered elements or limitations of the appended claims except where explicitly recited in a claim(s).

The various embodiments disclosed herein may be implemented as a system, method or computer program product. Accordingly, aspects may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects may take the form of a computer program product embodied in one or more computer-readable medium(s) having computer-readable program code embodied thereon.

Computer program code for carrying out one or more operations for aspects of this disclosure or otherwise related to one or more operations for aspects of this disclosure may be written in any combination of one or more programming languages. Moreover, such computer program code can execute using a single computer system or by multiple computer systems communicating with one another (e.g., using a local area network (LAN), wide area network (WAN), the Internet, etc.). While various features in the preceding are described with reference to flowchart illustrations and/or block diagrams, a person of ordinary skill in the art will understand that each block of the flowchart illustrations and/or block diagrams, as well as combinations of blocks in the flowchart illustrations and/or block diagrams, can be implemented by computer logic (e.g., computer program instructions, hardware logic, a combination of the two, etc.). Generally, computer program instructions may be provided to a processor(s) of a general-purpose computer, special-purpose computer, or other programmable data processing apparatus. Moreover, the execution of such computer program instructions using the processor(s) produces a machine that can carry out a function(s) or act(s) specified in the flowchart and/or block diagram block or blocks.

Block diagrams in the Figures may illustrate the architecture, functionality and/or operation of possible implementations of various embodiments of this disclosure. In this regard, each block in any flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

Implementations consistent with this disclosure may provide one or more solutions to problems referenced above and experienced in the field, amongst other problems solved by implementations according to this disclosure. According to aspects of this disclosure, magnetic transformer core properties can be quantified by screening two-pole toroidal current transformers (CTs) using a simple new method in combination hardware elements described herein.

Implementations consistent with this disclosure may enable use of a generic test circuit (e.g., no dedicated miniature circuit breaker (MCB) board required, such as a ncafi printed circuit board assembly (PCBA)). Engineering support to CT suppliers may be reduced for implementations consistent with this disclosure. Provided is a simple core loss characterization method which can be extrapolated to two pin current transformers (CTs) (e.g., ncafi, legacy), four-pin CTs, and/or other configurations. Ease of screening CTs may be provided including CT placement (e.g., on a nest of a testing system) and for hardware design (PCBA, LabVIEW, NI, and its testing sequence). Further advantages for implementations according to present disclosure include easy automation implementation (e.g., during production).

Embodiments can include any suitable computer hardware and/or software module(s) to perform any suitable function (e.g., as disclosed herein). Any suitable method(s) or portion(s) thereof disclosed herein can be performed on and/or by any suitable hardware and/or software module(s). Any suitable method(s) and/or portion(s) thereof disclosed herein can be embodied as computer executable instructions stored on a non-transitory computer readable medium, for example.

As will be appreciated by those skilled in the art, aspects of this disclosure may be embodied as a system, method or computer program product. Accordingly, aspects of this disclosure may take the form of an entirely hardware embodiment, an entirely software embodiment (including firmware, resident software, microcode, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of this disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A system for characterizing core loss for a device under test (DUT), comprising:
a core loss module coupleable to a current source, the core loss module including a nest configured to receive the DUT, wherein the DUT comprises a current transformer; and
an electronic device configured to receive output corresponding to the core loss module and configured to perform at least one operation to determine a core loss expressed in terms of a resistance associated with the current transformer.

2. The system of claim 1, wherein the core loss module further includes a resonant circuit between the current source and the DUT and a signal conditioning module connected to the resonant circuit downstream of the resonant circuit and to the DUT.

3. The system of claim 2, wherein the core loss module further includes a data acquisition (DAQ) module, wherein the signal conditioning module is connected to the DAQ module to send conditioned signals to the DAQ module.

4. The system of claim 1, further comprising an impedance measurement device coupleable between the core loss module and to the electronic device to receive output signals from the DUT and to send impedance measurement signals to the electronic device.

5. The system of claim 1, further comprising a digital multimeter coupleable to the core loss module and to the electronic device to receive output signals from the DUT and to send multimeter measurement signals to the electronic device.

6. The system of claim 1, wherein the current transformer is part of a circuit breaker.

7. The system of claim 1, wherein the current transformer is configured for ground-neutral detection.

8. The system of claim 1, wherein the nest comprises:
a first housing having a first recess configured to receive a first portion of the DUT;
a second housing moveably connected to the first housing and having a second recess configured to receive a second portion of the DUT to retain the DUT to the first housing in a closed state; and
a latch operatively connected to the first housing and the second housing, the latch configured to releasably latch the second housing to the first housing in a closed state.

9. The nest of claim 8, wherein the first recess includes a conformal shape to the DUT.

10. The nest of claim 8, wherein the first recess includes one or more terminal alignment features configured to align one or more DUT terminals to one or more terminal connections.

11. The nest of claim 8, wherein the nest further comprises a hinge connecting the second housing to the first housing.

12. The nest of claim 11, wherein the hinge is on an opposite side relative to the latch.

13. A system, comprising:
a core loss module coupleable to a current source, the core loss module including a nest configured to receive a current transformer;
an impedance meter coupled to the nest, wherein the impedance meter is configured to perform a measurement of impedance associated with the current transformer;
a resistance meter coupled to the nest, wherein the resistance meter is configured to perform a measurement of resistance associated with the current transformer; and
an electronic device configured to determine a core loss associated with the current transformer based on the measurement of resistance performed by the resistance meter and the measurement of impedance performed by the impedance meter.

14. The system of claim 13, wherein the current transformer is part of a circuit breaker.

15. The system of claim 13, wherein the nest comprises:
a first housing having a first recess configured to receive a first portion of the current transformer;
a second housing moveably connected to the first housing and having a second recess configured to receive a second portion of the current transformer to retain the current transformer to the first housing in a closed state; and
a latch operatively connected to the first housing and the second housing, the latch configured to releasably latch the second housing to the first housing in a closed state.

16. The nest of claim 15, wherein the nest further comprises a hinge connecting the second housing to the first housing.

17. The system of claim 13, wherein the current transformer is configured for ground-neutral detection.

18. A system for characterizing core loss for a device under test (DUT), comprising:
a core loss module coupleable to a current source, the core loss module including a nest configured to receive the DUT, wherein the DUT comprises a current transformer and wherein the nest comprises a housing having a recess configured to retain the current transformer; and
an electronic device configured to receive output corresponding to the core loss module and configured to perform at least one operation to determine a core loss associated with the current transformer.

19. The system of claim 18, wherein the nest comprises:
a first housing having a first recess configured to receive a first portion of the current transformer;
a second housing moveably connected to the first housing and having a second recess configured to receive a second portion of the current transformer to retain the current transformer to the first housing in a closed state; and
a latch operatively connected to the first housing and the second housing, the latch configured to releasably latch the second housing to the first housing in a closed state.

20. The nest of claim 19, wherein the nest further comprises a hinge connecting the second housing to the first housing.

* * * * *